United States Patent [19]

Jaecklin

[11] Patent Number: 4,742,382
[45] Date of Patent: May 3, 1988

[54] SEMICONDUCTOR COMPONENT

[75] Inventor: André Jaecklin, Ennetbaden, Switzerland

[73] Assignee: BBC Brown, Boveri & Company, Limited, Baden, Switzerland

[21] Appl. No.: 829,514

[22] Filed: Feb. 14, 1986

[30] Foreign Application Priority Data

Mar. 20, 1985 [CH] Switzerland ............... 1237/85

[51] Int. Cl.$^4$ ............... H01L 29/747; H01L 29/74; H01L 29/06; H01L 29/90
[52] U.S. Cl. ............... 357/39; 357/38; 357/55; 357/13; 357/46
[58] Field of Search ............... 357/39, 38, 55, 13, 357/46

[56] References Cited

U.S. PATENT DOCUMENTS

| | | | |
|---|---|---|---|
| 3,947,864 | 3/1976 | Yatsuo et al. | 357/39 |
| 3,994,011 | 11/1976 | Misawa et al. | 357/13 |
| 4,009,059 | 2/1977 | Nakata | 357/38 |
| 4,031,607 | 6/1977 | Cline et al. | 357/39 |
| 4,150,391 | 4/1979 | Jaecklin | 357/38 |
| 4,298,881 | 11/1981 | Sakurada et al. | 357/38 |
| 4,530,000 | 7/1985 | Van de Wouw et al. | 357/46 |

FOREIGN PATENT DOCUMENTS 0141582 11/1979 Japan ............... 357/39 C

*Primary Examiner*—Andrew J. James
*Assistant Examiner*—Robert P. Limanek
*Attorney, Agent, or Firm*—Oblon, Fisher, Spivak, McClelland & Maier

[57] ABSTRACT

A semiconductor component, including a GTO thyristor and integrally formed reverse conducting antiparallel diode, which can be used for turn-off of currents of 20 A ... >2,000 A and off-state voltages of 600 V ... >4,500 V in power electronics for driving electric vehicle motors, for direct-current choppers, converters, electric filters and so forth. A thyristor region including several parallel-connected individual gate turn-off (GTO) thyristors is separated by a protective zone form a diode region and electrically substantially decoupled in such a manner that only a few free charge carriers can reach the thyristor region during the conducting phase of the diode. For this purpose, the distance between the bottom of the recess in the protective zone and a space charge zone is kept small. Preferably, a second pn junction in the region of the protective zone extends to the bottom of the protective zone at two points. At the anode side, several protective rings can be provided to facilitate the turning off of the GTO thyristor.

14 Claims, 2 Drawing Sheets

SEMICONDUCTOR COMPONENT

BACKGROUND OF THE INVENTION

1. Field of the Invention

This invention relates to a reverse-conducting gate turn-off (GTO) thyristor for high current and high voltage switching applications.

2. Discussion of Background

Such a semiconductor component as above noted is described in Swiss Patent Specification No. 594,989. In this document, a reverse-conducting thyristor is specified which combines a thyristor and an antiparallel diode on one silicon disk. Special protective rings in the component prevent the two components from mutually influencing each other.

Such reverse-conducting thyristors are used in power electronics as direct-current choppers, converters, uninterruptible power supply systems, electric filters and so forth, (compare the Swiss firm's journal Brown Boveri Mitteilungen 1 (1979), pages 5–10). In all cases in which an inductive load is driven, for example a motor in the field of traction, a current path must be provided in the opposite direction to the conduction direction of the thyristor. A disadvantageous feature of this arrangement is that the turning of of conventional thyristors in self-commutated circuits requires a commutating circuit.

From Hitachi Review, Vol. 31 (1982), No. 1, pages 23–27, it is known to use gate turn-off (GTO) thyristors instead of the conventional thyristors.

GTO thyristors can be obtained with a very wide range of turn-off currents (20 A ... >2,000 A) and voltages (600 V ... >4,500 V), (compare IEEE Transaction on Electron Devices, Vol. ED-31, No. 12, December 1984, pages 1681–1686).

If a GTO thyristor is connected in antiparallel with a separate diode, the following problems occur:

the stray inductance of the external circuit leads to overvoltages which can be damaging to the GTO thyristor, the characteristics of the diode must be matched to the GTO thyristor which can be guaranteed only in a few cases, the costs are relatively high.

SUMMARY OF THE INVENTION

Accordingly, an object of this invention is to produce a new and improved semiconductor component including a GTO thyristor and an integrally constructed antiparallel diode, wherein the control current of the GTO thyristor is decoupled as well as possible from the diode.

The foregoing and other objects are achieved according to the invention by providing a novel semiconductor component including at least one gate turn-off (GTO) thyristor formed of at least four charge carrier layers of alternating first and second conductivity types, including a first outer charge carrier layer which forms a cathode at a first surface, a second outer charge carrier layer which forms an anode at a second surface, a gate electrode formed on a first inner charge carrier layer which adjoins the first outer charge carrier layer along a first layer side, and a second inner charge carrier layer which adjoins a second layer side of the first inner charge carrier layer. Integrally formed in parallel with the GTO thyristor by a protective zone which includes a space charge zone formed on the opposite sides of a second pn junction existing between the first inner charge carrier layer and the second inner charge carrier layer. The first and second inner charge carrier layers extend from a region of the component including the GTO thyristor into a diode region including the diode. According to a first embodiment, the space charge zone extends along the second pn junction in a region of the protective zone to a first surface of the protective zone and a passivation layer is provided covering the first surface of the protective zone. According to a second embodiment, the first surface of the semiconductor component has a distance within a range of 1 $\mu$m ... 30 $\mu$m from the space charge zone along the second pn junction in the region of the protective zone.

An advantage of the invention consists in the fact that the resultant costs for the user are lower. The costs of an integrated element are lower than those of thyristor and diode separately. There are no mounting costs for a separate diode. Decoupling a GTO thyristor and diode prevents a cathode short circuit. At the same time, it is guaranteed that during the conducting phase of the diode only a few free charge carriers reach the area of the GTO thyristor so that triggering errors which could lead to a destruction of the component are prevented at the thyristor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
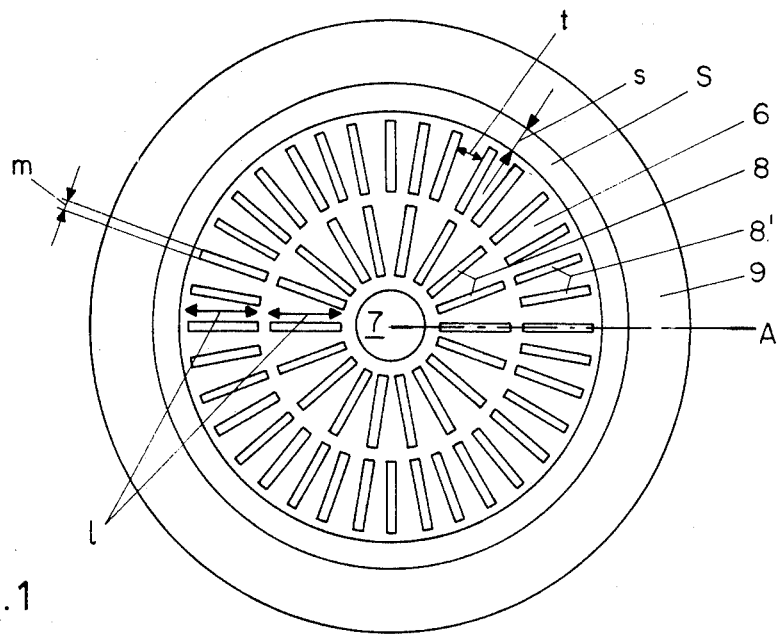
FIG. 1 is a top view of a disk-shaped rotationally symmetric semiconductor component.

Referring now to the drawings, wherein like reference numerals designate identical or corresponding parts throughout the several views, and more particularly to FIG. 1 thereof, the circular semiconductor disk, not shown to scale within the range of 100 $\mu$m ... 500 $\mu$m, preferably within the range of 200 $\mu$m ... 400 $\mu$m. The means distance t in the circumferential direction between adjacent GTO cathode electrodes 8 and 8' is within the range of 0.3 mm ... 0.5 mm. The radial distance r between the GTO cathode electrodes 8 and 8', compare FIG. 2, is within the range of 100 $\mu$m ... 1 mm, preferably within the range of 300 $\mu$m ... 500 $\mu$m.

Along the outer circumference of the semiconductor disk, an electrode 9 of a diode anode is located. Between the electrode 9 and the area of the GTO thyristor, a protective zone S of width s of typically at least two carrier diffusion lengths is located. This width s must be selected to be of such a size that only a small number of free charge carriers reach the area of the GTO thyristor during the conducting phase of the diode D. The radial distance between the GTO cathode electrodes 8' and the protective zone S is within the range of 10 μm . . . 1 mm, preferably within the range of 100 μm . . . 300 μm.

The semiconductor disk has a diameter, depending on the maximum gate turn-off current intensity required, within a range of 10 mm . . . 100 mm and a thickness, depending on the off-state voltage required, within a range of 200 μm . . . 1.5 mm.

Figure 2:
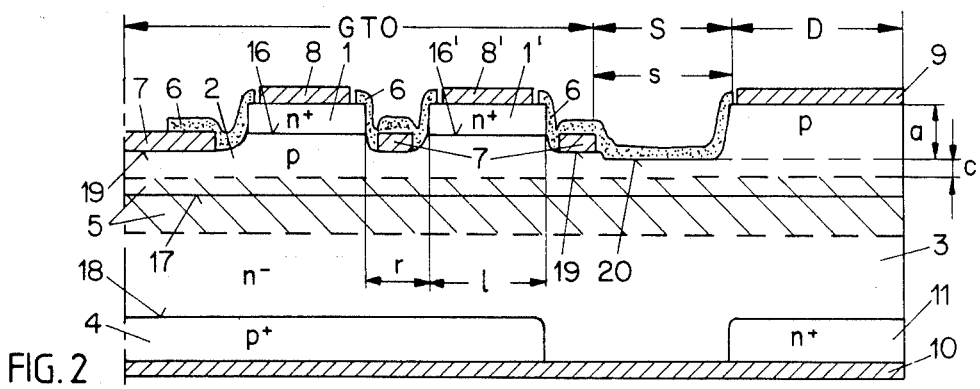
FIG. 2 is a cross-sectional view through a part of the semiconductor component according to FIG. 1 along line A.

The cross-section along line A in FIG. 1, shown diagrammatically in FIG. 2, from the center of the semiconductor disk to its right-hand edge shows in its lefthand part a region, designated by GTO, of two gate turn-off thyristors, briefly called GTO region, which is connected via the protective zone S to the diode region D in the right-hand part.

The GTO region has for each thyristor 4 charge carrier layers of alternating n-type and p-type conduction, these being for each thyristor a separate highly-doped ntype emitter layer or an n+-type emitter layer 1 or 1' as the GTO cathode layer having a donor concentration at the surface within the range of $10^{19}$ cm$^{-3}$ . . . $10^{21}$ cm$^{-3}$, a p-type p base layer 2 with medium doping and common to both thyristors, having an acceptor concentration at the surface within the range of $10^{17}$ cm$^{-3}$ . . . $10^{19}$ cm$^{-3}$, an n-type n− base layer 3 with low doping and common to both thyristors and having a donor concentration within a range of $10^{13}$ cm$^{-3}$ . . . $10^{15}$ cm$^{-3}$ and a common highly doped p-type p+ emitter layer 4 as the GTO anode layer having an acceptor concentration within a range of $10^{18}$ cm$^{-3}$ . . . $10^{20}$ cm$^{-3}$ at the surface.

A first pn junction between the n+ emitter layer 1, 1' and the p base layer 2 is designated by 16, a second pn junction between the p base layer 2 and the n− base layer 3 by 17 and a third pn junction between the n− base layer 3 and the p+ emitter layer 4 by 18. A space charge zone at both sides of the second pn junction 17 is designated by 5. Numeral 7 designates a gate electrode which is located recessed with respect to the n+ emitter layers 1 and 1' and which surrounds the GTO cathode electrodes 8 and 8' at a distance. The surface 19 of the gate electrode region covered by the gate electrode layer 7 and in contact with it is located lower than the first pn junction 16.

The p base layer 2 and the n− base layer 3 extend from the thyristor region GTO via the protective zone 5 into the diode region D. At this location, the p base layer 2 forms the anode of the diode D. Diode D carries an electrode layer 9 which lies at the same level as the GTO cathode electrodes 8 and 8'. In the diode region D, the n− base layer 3 adjoins a highly doped n-type n+ diode layer which forms the diode cathode. Both the p+ emitter layer 4 of the GTO and the n− base layer 3 in the region of the protective zone S and the n+ diode layer 11 have the same level at their outer surface and are electrically bonded by a metal layer 10 which is common to all and which forms a first main electrode of the semiconductor component.

All electrodes and electrode layers consist of aluminum. Naturally, other metals such as gold, platinum etc. are also suitable for electric bonding.

The passivation layer 6 is applied between the GTO gate electrode layer 7 and the GTO cathode electrodes 8 and 8' and electrode 9 of the diode anode. This passivation layer 6 can cover the gate electrode layer 7 apart from a central region provided for the electrical connection, but not the GTO cathode electrodes 8 and 8' and the electrode 9 since otherwise their common electric bonding to a molybdenum layer 13, serving as the second main electrode, compare FIG. 3, would not be guaranteed. For safety reasons, there can be a small distance between the passivation layer 6 and the GTO cathode electrodes 8 and 8' and the electrodes 9. In principle, passivation of the surface 20 in the area of the protective zone is not required.

The greatest depth a of the recess of the protective zone S from the surface of the GTO cathode layer 1 and 1' is within a range of 10 μm . . . 100 μm. The surface 20 of the protective zone region S is a little lower than the surface 19 of the adjoining gate electrode region. The space charge zone 5 has a distance c within a range of 1 μm . . . 30 um, preferably 1 μm . . . 10 μm from the surface 20 so that is does not reach this surface 20 at any point of the protective zone S.

The life of the charge carriers in the diode is preferably adjusted to be shorter than in the thyristor by installing atoms of heavy metals such as gold or platinum into the silicon base material of the semiconductor component or by electron or gamma irradiation.

Figure 3:
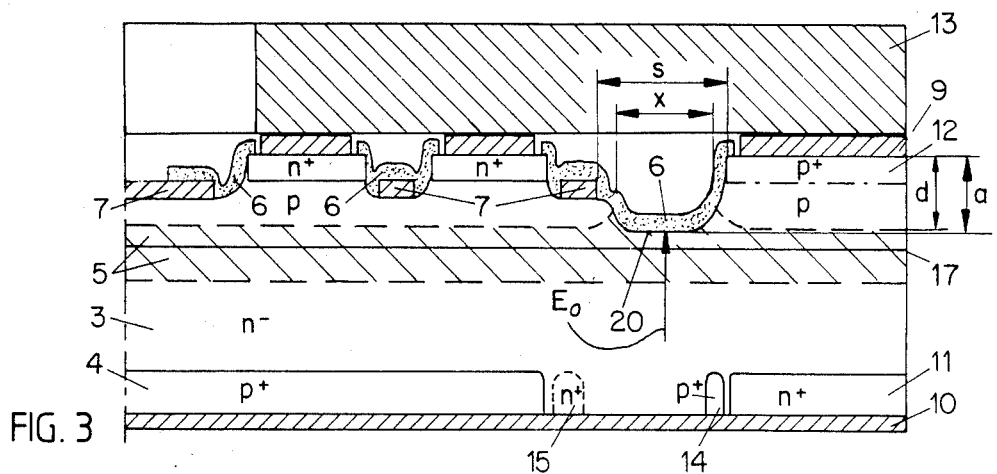
FIGS. 3, 4, 6 are cross-sectional views through parts of semiconductor components according to additional embodiments of the invention.

To achieve better decoupling between the diode D and thyristor GTO, a p+-type protective ring 14 and an n+-type protective ring 15 can be applied in the region of the protective zone S at a small distance adjoining the n+ diode layer 11 and preferably also the p+ emitter layer 4 as shown in the embodiment according to FIG. 3. It is important that the width s of the protective zone S and the depth a, created by etching, of the recess in the protective zone S are of such a size that an undesirable current component from the gate electrode layer 7 to the diode anode remains negligibly small during the firing and turn-off process of the GTO thyristor.

Further improvement in the decoupling between the diode D and the GTO thyristor is achieved by the semiconductor component partially represented in cross-section in FIG. 3. Here the space charge zone 5 is the carried along a partial width x of the protective zone S to its surface 20, the distance d between the undisturbed space charge zone 5 and the surface of the GTO cathode layer 1 and 1' or the surface of a p+ diode layer 12 being smaller than the maximum depth a of the recess of the protective zone S. The difference a−d lies within a range of 1 μm–30 μm, preferably within a range of 1 μm–10 μm. The partial width x is approximately of the same size as the width s of the protective zone S.

The recess in the region of the protective zone S, which in FIG. 3 is deeper compared with FIG. 2, is preferably created by etching after the last high-temperature treatment of the semiconductor component.

The second pn junction 17 is sufficiently far below the lowest surface 20 of the protective zone region so that the field strength $E_0$ below this surface is $<20\times10^5$ V/cm, preferably $<2\times10^4$ V/cm.

In this embodiment and in the embodiments of the semiconductor components according to FIGS. 4–7, passivation by a passivation layer 6 is required in the region of the protective zone S.

During the firing process of the GTO thyristor, a parasitic gate electrode current is blocked by this embodiment of the semiconductor component. During the main portion of the turn-off process, a conductive channel is available. As a side effect, an off-state voltage of the semi-conductor component is produced which is reduced by a few per cent. In the diode region, an improved charge carrier injection can be obtained by means of the p+-type layer 12 serving as diode anode between the p base layer 2 and the electrode 9.

Figure 4:
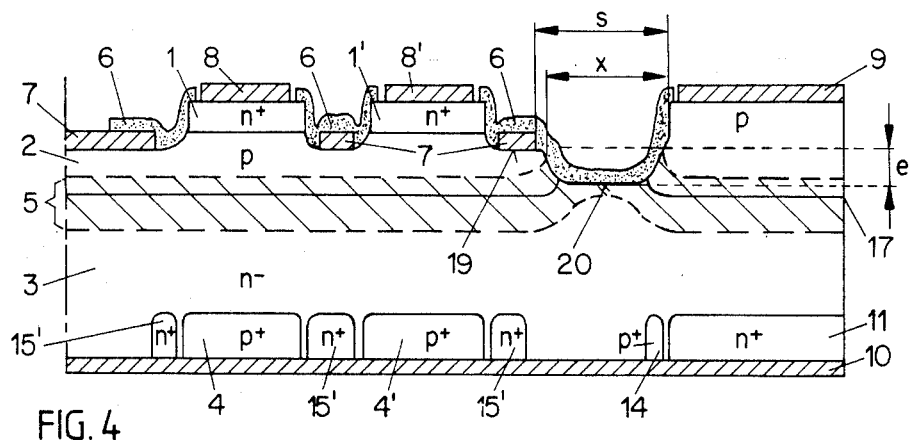

In the embodiment of the semiconductor component according to FIG. 4, the second pn junction 17 in the region of the protective zone S is carried to its lowest surface 20. This surface 20 is deeper by an additional depth or by a distance e within a range of 1 µm . . . 50 µm, preferably within a range of 1 µm . . . 20 µm than the surface 19 of the gate electrode region.

This embodiment of the semiconductor component is achieved by a homogeneous installation of acceptors such as boron, aluminum or gallium in the upper region of the silicon disk which is later intended to create the p base layer 2. Next, the p base layer 2 is removed, for example by etching, over the partial width x of the protective zone S. This is followed by tempering. During the tempering, a thermal diffusion of the acceptors of the p base layer occurs which sets the desired depth of the pn junction 17. Since the acceptors have been removed within the region of the recess of the protective zone S, the second pn junction 17 and the space charge zone 5 arch upwards at the edge of the protective zone. The surface is lowered in the gate region of the GTO thyristor and preferably also in the protective zone by at least the thickness of the n+ emitter layer 1 and 1' to the level of the surface 19 by subsequent etching. The partial width x of the protective zone S is within the range of 0.1 mm . . . 1 mm. For large values of the protective zone since the maximum field strength can reach $E_0 \approx 10^5$ V/cm.

During the firing process, a parasitic gate electrode current is blocked; during the turn-off process, the protective zone S acts like a lateral pnp transistor without base current which blocks a parasitic gate electrode current. As a side effect, however, the resultant off-state voltage is greatly reduced with a large partial width x.

In the anode region of the GTO thyristor, the p+ emitter layer is interrupted in the gate electrode region by n+ anode short-circuit zones 15' which facilitate the thyristor turn-off.

These anode short-circuits take over the function of the protective ring 15 in FIG. 3.

Figures 5, 7:
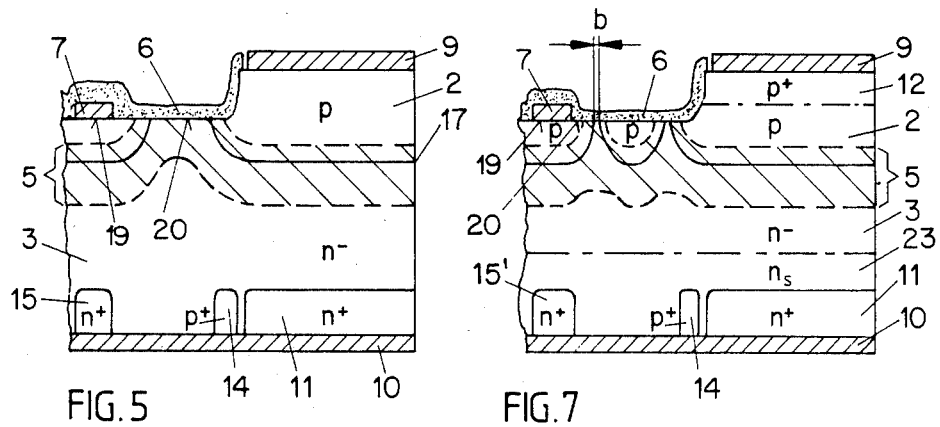
FIGS. 5 and 7 are cross-sectional views of parts of additional embodiments of a protective zone between a diode and GTO thyristor according to FIGS. 4 and 6.

The embodiment of the semiconductor component according to FIG. 5 differs from that of FIG. 4 in that the surface 19 in the gate electrode region is at the same level as the surface 20 in the protective zone S and the second pn junction 17 and the space charge zone 5 are more deformed within the region of the protective zone. This is achieved by installation, which is masked in the region of the protective zone S, of acceptors into the p base layer 2 and omitting the first etching process.

Figure 6:
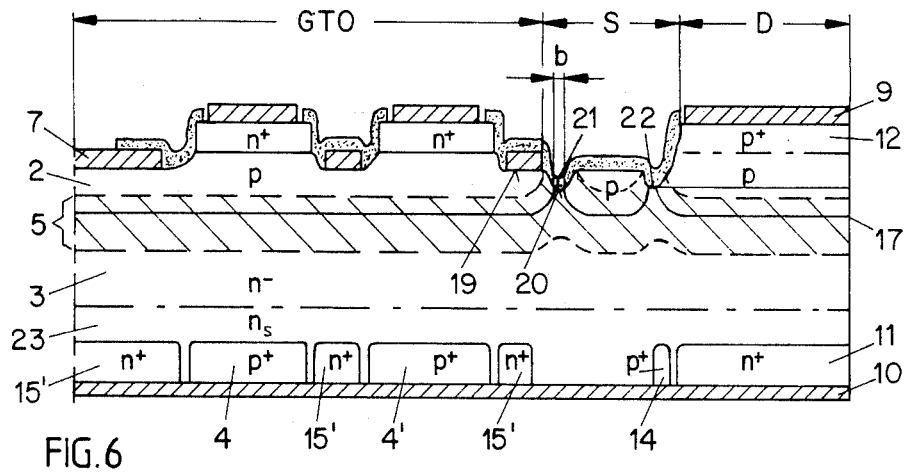

In the embodiment of the semiconductor component according to FIG. 6, a weakly-doped $n_s$ base layer 23 with a donor concentration within a range of $10^{14}$ cm$^{-3}$ . . . $10^{16}$ cm$^{-3}$ is provided below the n− base layer 3. Within the region of the protective zone S, the second pn junction 17 and the space charge zone 5 are carried to its lowest surface 20 at a first and second protective zone contact point 21 and 33 of the same width b in each case. The width b depends on the lateral diffusion and lies within a range of up to 300 µm and preferably within a range of up to 100 µm. It is only in the contact region of the space charge zone 5 that the surface 20 is lower than the surface 19 of the gate electrode region so that a part of the p base layer 2 reaches up to the surface of the protective zone S between the protective zone contact points 21 and 22. This development is achieved by the method described in conjunction with FIG. 4 but the first removal (for example by etching) is limited to the two protective zone contact points 21 and 22.

The configuration of the diode structure corresponds to that of FIG. 3. The n+ anode short circuit zone 15' in the central region of the semiconductor component is widened as compared with that of FIG. 6 and extends over the diameter of the central part of the gate electrode 7.

The embodiment of the semiconductor component according to FIG. 7 differs from that according to FIG. 6 in that the surface 19 in the gate electrode region is at the same level as the surface 20 in the protective zone S. As in the embodiment according to FIG. 5, this is again achieved by the masked installation of the acceptors in the p base layer 2 and omitting the first etching process.

Instead of two protective zone contact points 21 and 22, more can also be provided and have a similar effect as the protective ring structure known from the journal of the Japan Society of Applied Physics, Vol. 43, 1974, pp. 395–400.

During the firing process, a parasitic gate electrode current is blocked. during the turn-off process, the protective zone corresponds to several lateral series-connected pnp transistors without base current which block a parasitic gate electrode current. It is of advantage if the protective zone width s can be kept at <1 mm so that only a little semiconductor surface is lost for conducting an electric current. Within the region of the protective zone, the field strength $E_0$ remains $\approx 10^4$ V/cm, that is to say the demands on the passivation layer 6 are modest.

A reduction of the off-state voltage of only approximately 10% can be achieved. This can be desirable since this results in a selective voltage break-through below the surface which corresponds to an integrated protective function and thus increased ruggedness.

Naturally, instead of the diode region D several of these can be provided on the same semiconductor component. Instead of the two circular zones with GTO thyristors, shown in FIG. 1, three or more annular zones with GTO thyristors can also be provided. The semiconductor body can have a square or other shape. The protective zone S can additionally have recesses or troughs. It is important that the thyristor and diode regions are well decoupled from each other so that only a few charge carriers can change over into the other regions in each case.

Obviously, numerous modifications and variations of the present invention are possible in light of the above teachings. It is therefore to be understood that within the scope of the appended claims, the invention may be practices otherwise than as specifically described herein.

What is claimed as new and desired to be secured by Letters Patent of the United States is:

1. A semiconductor component comprising:
    at least one gate turn-off (GTO) thyristor formed of at least four charge carrier layer of alternating conductivity types, including an n+- type emitter layer adjoining a first surface in a cathode region, a p-type base layer adjoining said n+-type emitter and forming thereby a first pn junction, said p-type base layer adjoining the first surface in a gate electrode region, whereby said surface in said gate electrode region is located lower than said first pn junction, an n-type base layer adjoining said p-type base layer and forming thereby a second pn junction surrounded by a space charge zone, and a p-type emitter layer;

at least one diode spaced apart from said at least one GTO thyristor and being at least formed by said p-type base layer, said n-type base layer and a highly doped n-type diode layer, which forms a diode cathode;

a protective zone separating said diode and said GTO thyristor and comprising said space charge zone, extending from a region including said GTO thyristor to a region including said diode, and a first surface in the region of the protective zone, which is at least as deep as the first surface in the gate electrode region and not deeper than the second pn junction in the GTO thyristor; and at least one gate electrode region laterally adjoining the protective zone.

2. A semiconductor component as claimed in claim 1, wherein said space charge zone extends to said first surface in the region of the protective zone and wherein said first surface in the region of the protective zone is covered by a passivation layer.

3. A semiconductor component as claimed in claim 1, wherein the first surface in the region of the protective region is separated by a distance (c) within a range of 1 μm–30 μm from said space charge zone.

4. A semiconductor component as claimed in claim 2, wherein the second pn junction is carried to the first surface of the protective zone at at least one protective zone contact region of a given width (b).

5. A semiconductor component as claimed in claim 4, wherein the second pn junction is carried to the first surface of the protective zone at two protective zone contact regions, each having a width (b) within a range of up to 300 μm.

6. A semiconductor component as claimed in claim 5, wherein said width (b) is within a range of up to 100 μm.

7. A semiconductor component as claimed in claim 5, wherein between the two protective zone contact regions along a part region of the first surface of the protective zone, the space charge zone is spaced apart from said first surface.

8. A semiconductor component as claimed in claim 5, wherein the second pn junction is carried to the first surface at the lowest part of the first surface in the region of the protective zone.

9. A semiconductor component as claimed in claim 8, wherein the lowest part of the first surface in the region of the protective zone is located deeper than the first surface in the gate electrode region by an additional depth within a range of 1 μm–50 μm.

10. A semiconductor component as claimed in claim 8, wherein said first surface in the region of the protective zone is located as deep as the first surface in the gate electrode region.

11. A semiconductor component as claimed in claim 6, wherein the distance d between the undisturbed space charge zone of the unbiased semiconductor component and the first surface in the cathode region is by a difference in the range of 1 μm–30 μm greater than the maximum depth of the first surface in the region of the protective zone.

12. A semiconductor component as claimed in claim 11, wherein the second pn junction is formed sufficiently lower than the first surface in the region of the protective zone for a field strength ($E_o$) in the space charge zone of the unbiased semiconductor component below this surface to be $<10^5$ V/cm at least over a part width (x) of the protective zone, said part width (x) being approximately equal to the total width (s) of the protective zone.

13. A semiconductor component as claimed in claim 12, wherein the second pn junction is formed sufficiently lower than the first surface in the region of the protective zone for a field strength ($E_o$) in the space charge zone of the unbiased semiconductor component below this surface to be $<2\times10^4$ V/cm at least over a part width (x) of the protective zone, said part width (x) being approximately equal to the total width (s) of the protective zone.

14. A semiconductor component as claimed in claim 13, wherein charge carriers formed in the diode region have a shorter life time than in the region of the GTO thyristor, comprising:

a highly p-doped electron capture zone provided at a small distance from the diode cathode in an outer region of the protective zone which is located between the anode of the GTO thyristor and a diode cathode; and a highly n-doped hole capture zone provided at a small distance from the anode of the GTO thyristor in an inner region of the protective zone.

* * * * *